(12) United States Patent
Chen et al.

(10) Patent No.: US 12,483,264 B2
(45) Date of Patent: Nov. 25, 2025

(54) ANALOG-TO-DIGITAL CONVERTER WITH 3RD ORDER NOISE TRANSFER FUNCTION

(71) Applicant: THE REGENTS OF THE UNIVERSITY OF MICHIGAN, Ann Arbor, MI (US)

(72) Inventors: Hsiang-Wen Chen, Ann Arbor, MI (US); Michael P. Flynn, Ann Arbor, MI (US)

(73) Assignee: The Regents of The University of Michigan, Ann Arbor, MI (US)

( * ) Notice: Subject to any disclaimer, the term of this patent is extended or adjusted under 35 U.S.C. 154(b) by 207 days.

(21) Appl. No.: 18/208,588

(22) Filed: Jun. 12, 2023

(65) Prior Publication Data

US 2024/0413835 A1 Dec. 12, 2024

(51) Int. Cl.
*H03M 1/30* (2006.01)
*H03M 1/06* (2006.01)
*H03M 1/08* (2006.01)
*H03M 1/50* (2006.01)

(52) U.S. Cl.
CPC ......... *H03M 1/508* (2013.01); *H03M 1/0629* (2013.01); *H03M 1/0854* (2013.01)

(58) Field of Classification Search
CPC ........ H03M 1/60; H03M 3/464; H03M 3/368; H03M 3/458; H03M 1/0854; H03M 3/424; H03M 1/0836; H03M 3/422; H03M 3/438; H03M 3/454; H03M 1/0604; H03M 1/0626; H03M 1/468; H03M 1/66; H03M 1/1245; H03M 1/48; H03M 3/456; H03M 1/08; H03M 1/124; H03M 1/1265; H03M 3/344; H03M 3/432; H03M 1/002; H03M 1/06; H03M 1/0624; H03M 1/066; H03M 1/0682; H03M 1/1009; H03M 1/1033; H03M 1/12; H03M 1/1215; H03M 1/145; H03M 1/18; H03M 1/182; H03M 1/345; H03M 1/36; H03M 1/46; H03M 1/462; H03M 1/502; H03M 1/508; H03M 1/742; H03M 1/804; H03M 3/00
USPC ...................................................... 341/143
See application file for complete search history.

(56) References Cited

U.S. PATENT DOCUMENTS

| | | | | |
|---|---|---|---|---|
| 5,369,404 A * | 11/1994 | Galton | ..... | H03M 3/39 341/143 |
| 6,674,381 B1 * | 1/2004 | Gomez | ..... | H03M 3/328 341/143 |
| 6,876,717 B1 * | 4/2005 | Wang | ..... | H03K 23/66 377/126 |
| 7,783,274 B2 * | 8/2010 | Kerth | ..... | H04B 1/0007 455/326 |
| 8,988,264 B2 * | 3/2015 | Noh | ..... | H03M 1/60 341/143 |

(Continued)

*Primary Examiner* — Linh V Nguyen
(74) *Attorney, Agent, or Firm* — Harness, Dickey & Pierce, P.L.C.

(57) ABSTRACT

A VCO-Based Continuous-Time (CT) delta-sigma modulator (DSM) with a noise-shaping (NS) successive approximation register (SAR) quantizer for a 3rd order noise transfer function (NTF) is presented. An anti-aliasing filter (AAF) enables this new hybrid architecture. The 28 nm CMOS prototype NSQ VCO CTΣΔ achieves 84.2 dB SNDR and 86.8 dB DR within a 1 MHz bandwidth while consuming 1.62 mW at 100 MS/s. The core circuit occupies only 0.024 mm2. No calibration or coefficient tuning is required.

8 Claims, 6 Drawing Sheets

(56) References Cited

U.S. PATENT DOCUMENTS

| | | | | |
|---|---|---|---|---|
| 9,397,692 B1* | 7/2016 | Zanbaghi | ............... | H03M 3/438 |
| 9,407,276 B1* | 8/2016 | Coban | ................. | H03M 1/1009 |
| 9,774,345 B1* | 9/2017 | Yoshioka | ............ | H03M 1/0854 |
| 9,825,645 B1* | 11/2017 | Gaggl | ................. | H03M 1/0624 |
| 12,081,178 B2* | 9/2024 | Kinyua | ................... | H03M 1/60 |
| 12,143,126 B2* | 11/2024 | Kinyua | ................ | H03M 3/462 |
| 2012/0223850 A1* | 9/2012 | Su | ....................... | H03M 1/1265 |
| | | | | 341/155 |
| 2014/0368368 A1* | 12/2014 | Koli | ........................ | H03M 1/06 |
| | | | | 341/143 |
| 2017/0310334 A1* | 10/2017 | Chen | ....................... | H03M 1/14 |
| 2022/0069834 A1* | 3/2022 | Sahu | ...................... | H03M 1/468 |
| 2022/0166441 A1* | 5/2022 | Kim | ....................... | H03H 17/02 |
| 2022/0224348 A1* | 7/2022 | Perrott | .................... | H03L 7/093 |

* cited by examiner

ANALOG-TO-DIGITAL CONVERTER WITH 3RD ORDER NOISE TRANSFER FUNCTION

FIELD

The present disclosure relates to an analog-to-digital converter with a $3^{rd}$ order noise transfer function.

BACKGROUND

VCO integrators are attractive for continuous-time (CT) delta-sigma modulator (ΣΔ) ADCs due to their (1) compact area, (2) scalability, (3) non-saturating integration range, and (4) inherent mismatch rotating output pattern. However, the noise transfer function (NTF) order is often limited to less than 2, leading to an unfavorable tradeoff between bandwidth and resolution. For this reason, high-resolution (>75 dB) is only available for low bandwidths (<100 kHz). Cascading of VCOs can deliver a higher-order ΣΔ loop but requires complicated linearization and the introduction of a stabilization path—the limited Excess Loop Delay (ELD) budget also hinders the overall speed due to delay in quantizer or DAC shuffling logic.

Therefore, it is desirable to present an analog-to-digital converter with a $3^{rd}$ order noise transfer function.

This section provides background information related to the present disclosure which is not necessarily prior art.

SUMMARY

This section provides a general summary of the disclosure, and is not a comprehensive disclosure of its full scope or all of its features.

An analog-to-digital converter is presented with a $3^{rd}$ order noise transfer function. The analog-to-digital converter includes: a voltage controlled oscillator configured to receive an input voltage and outputs a voltage whose frequency varies according to the input voltage; a quantizer circuit with noise shaping capability; an anti-aliasing filter interconnected between an output of the voltage controlled oscillator and an input of the quantizer circuit; and a feedback path from an output of the quantizer to an input of voltage controlled oscillator. The notches of the anti-aliasing filter preferably align with sampling frequency of the quantizer circuit.

In one embodiment, the anti-aliasing filter includes an integration sampler circuit and an infinite impulse response filter and the quantizer circuit includes a successive approximation register with second order noise shaping.

In some embodiments, the quantizer circuit operates to convert a continuous analog signal from the anti-aliasing filter into a discrete digital representation using a binary search.

The analog-to-digital converter may further include a Johnson counter serially coupled to a phase detector, where the Johnson counter is configured to receive the output from the voltage controlled oscillator and operates to divide frequency of the output received from the voltage controlled oscillator.

The analog-to-digital converter may also include a clocked-averaging circuit in the feedback path, where the clocked-averaging circuit shifts bits in the output from the quantizer two bit positions towards least significant bit.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Example embodiments will now be described more fully with reference to the accompanying drawings.

Figure 1:
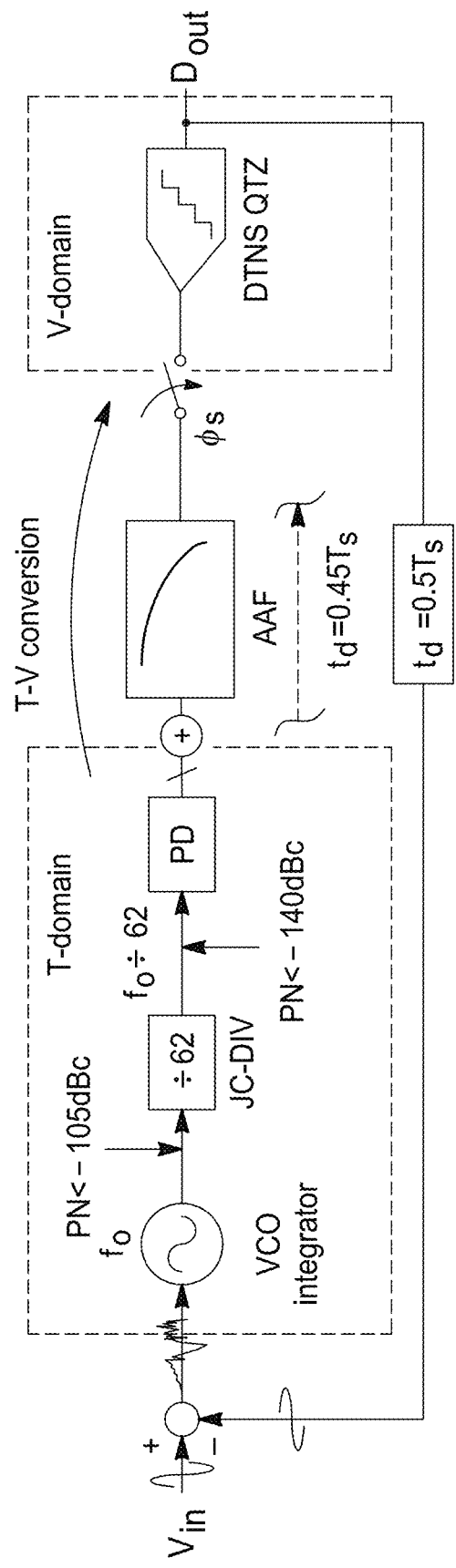
FIG. 1 is a diagram of a proposed hybrid architecture for achieving an analog-to-digital converter with a $3^{rd}$ order noise transfer function.

FIG. 1 depicts a proposed hybrid architecture for achieving an analog-to-digital converter (ADC) 10 with a $3^{rd}$ order noise transfer function (NTF). The ADC 10 is comprised of an anti-aliasing filter 14 interconnected between an output of a voltage controller oscillator (VCO) 11 and an input of a quantizer 15. The voltage controlled oscillator 11 is configured to receive an input voltage and outputs a voltage whose frequency varies according to the input voltage; whereas, the quantizer circuit 15 has noise shaping capability. In an example embodiment, the quantizer circuit 15 includes a successive approximation register (SAR) with second order noise shaping. The ADC 10 also includes a Johnson counter 12 serially coupled to a phase detector 13. As further described below, the Johnson counter 12 is configured to receive the output from the voltage controlled oscillator 11 and operates to divide frequency of the output received from the voltage controlled oscillator 11. A feedback path 16 couples the output of the quantizer to the input of the voltage controlled oscillator.

Figure 2A:
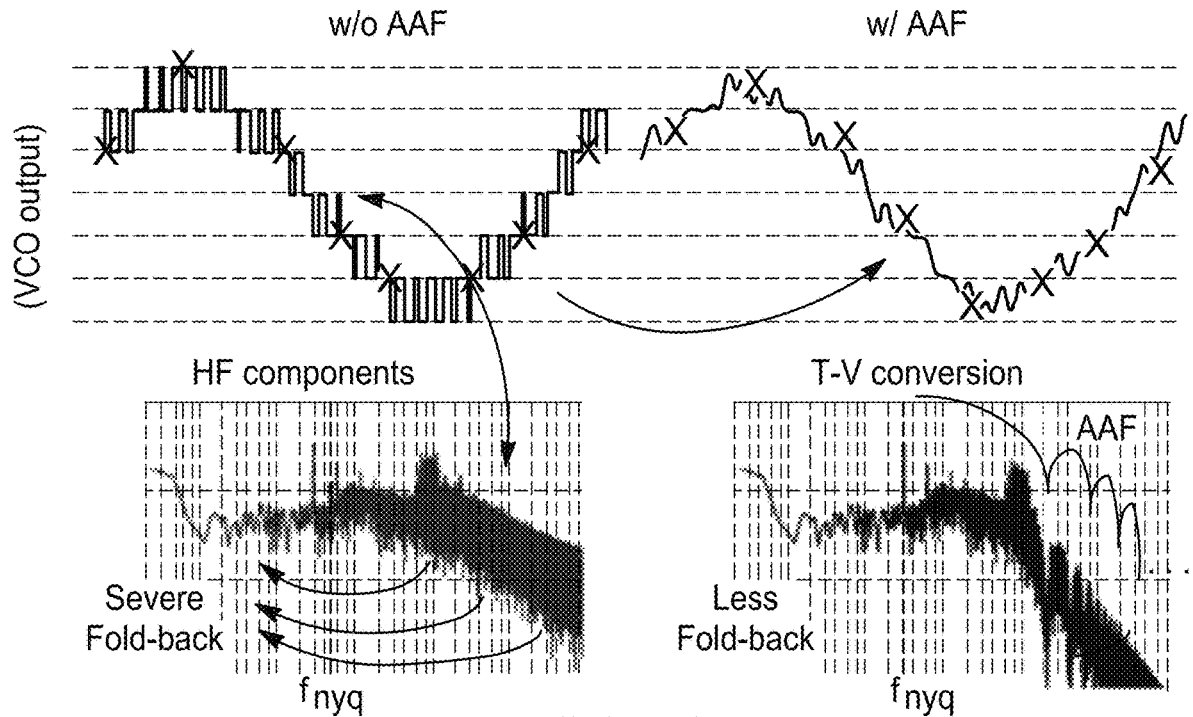
FIG. 2A is a graph showing time-domain and spectral visualization of direct output from the voltage controlled oscillator without filtering and with anti-aliasing filtering.
Figure 2B:
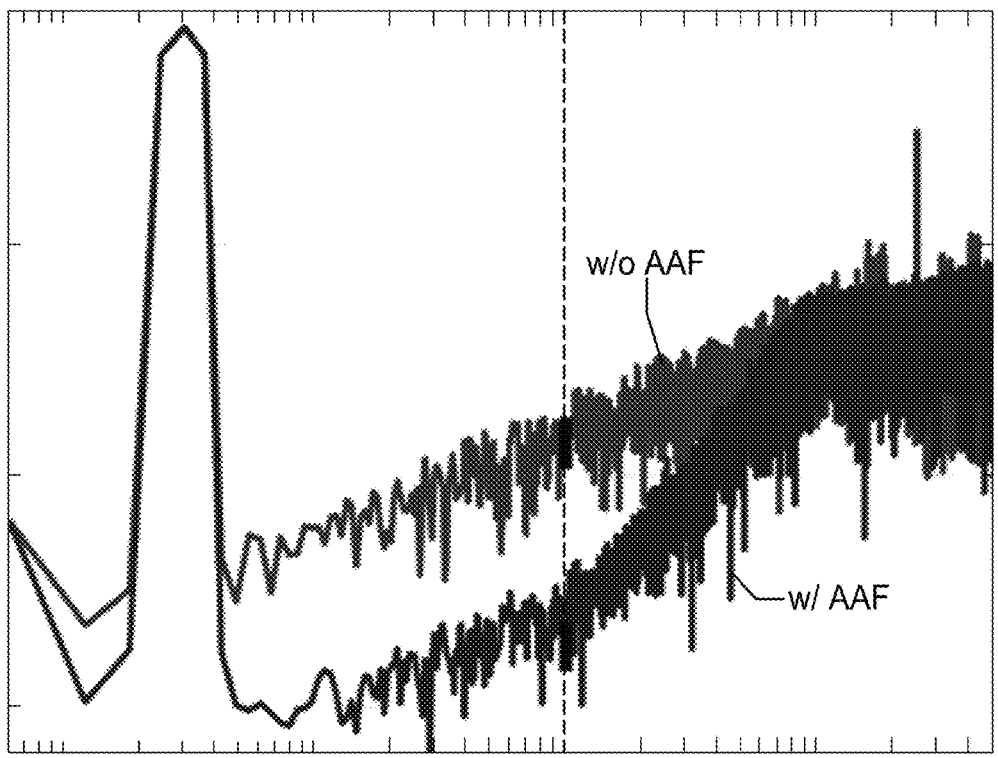
FIG. 2B is a graph showing closed-loop comparison in the presence of $2^{nd}$ order discrete time noise shaping quantizer.

During operation, the successive approximation register increases the noise transfer function order of conventional op amp-integrator CTΣΔ ADCs with low hardware cost and avoids complex compensation. However, until now, VCO-based integrators could not benefit from this approach because directly sampling the time-domain output of voltage controlled oscillator by the voltage-domain input of a noise shaping successive approximation register results in severe aliasing as seen in FIG. 2A. To unlock the potential of a VCO-NS SAR hybrid, the anti-aliasing filter 14 filters the voltage controlled oscillator output to reduce out-of-band components so very little folds back as also seen in FIG. 2A. As a result, the time-domain information is re-distributed into the voltage domain, enabling the combination of a compact VCO integrator with a hardware-efficient NS SAR quantizer.

Additionally, the hybrid ADC architecture 10 is robust to extra delay that the anti-aliasing filter adds to the ΣΔ loop. The 1st-order VCO CTΣΔ loop is stabilized by simply reducing the loop gain (Kvco) and still retains >100 dB SQNR since this loop gain change does not move NTF zeros contributed by noise shaping successive approximation register. Thus, hardware expensive excess loop delay compensation is avoided.

Figure 3A:
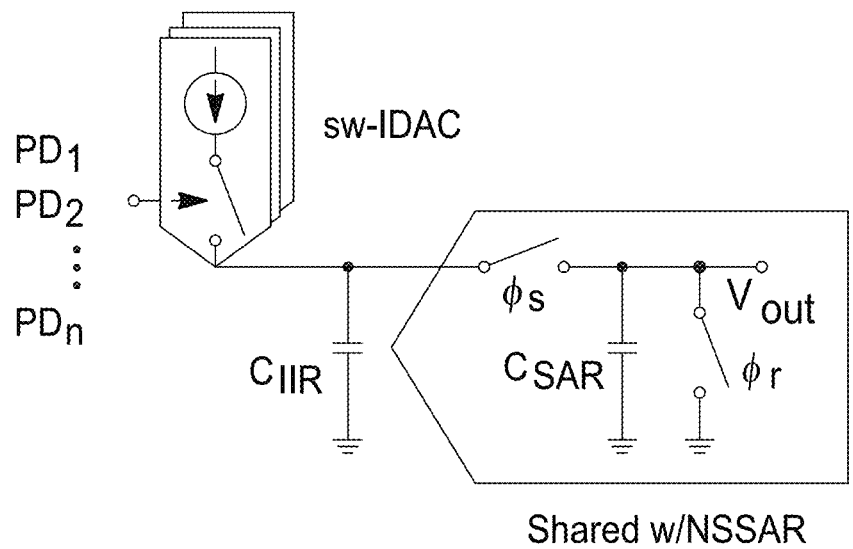
FIGS. 3A and 3B is a schematic for an implementation of the anti-aliasing filter and the equivalent signal flow diagram.
Figure 3B:
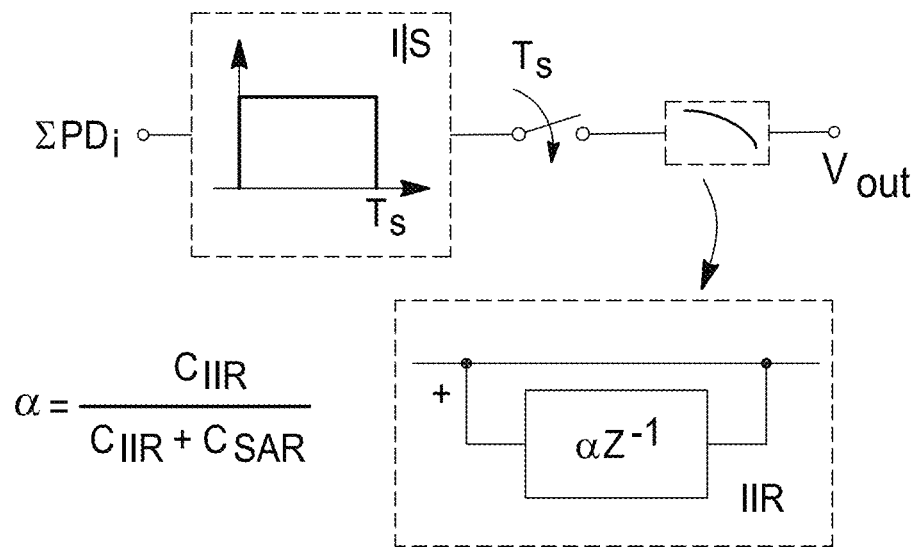

With reference to FIGS. 3A and 3B, the anti-aliasing filter 14 is implemented by an Integration Sampler (IS) circuit combined with an infinite impulse response (IIR) filter. The current sources and capacitors form the integration sampler circuit, which contributes a rectangular impulse response with anti-alias notches at frequencies N*Fs. That is, the notches of the anti-aliasing filter align with the sampling frequency of the quantizer circuit. The noise shaping successive approximation register samples by periodic charge-sharing between CIIR and CSAR, contributing to the IIR response and sharpening the out-of-band roll-off. As opposed to an active-RC filter where the op-amp consumes up to 320 uA (simulated), the IS-IIR structure easily integrates with the noise shaping successive approximation register and saves hardware and power. In addition, the potentially nonlinear gm cell of the original IS technique is replaced with a current-switching DAC (sw-IDAC). This switching operation greatly improves linearity. Furthermore, as all the current goes into the capacitors, thus power consumption is 20× lower than an active-RC AAF. Finally, the rotating VCO pattern shapes the mismatch of the IS-IIR current sources.

In the example embodiment, a stringent VCO Phase Noise (PN) of <−140 dBc@1 MHz is needed to meet the target ~90 dB DR performance. However, this phase noise is only possible with large capacitors or parasitics from large devices. So instead, the output of a compact, fast voltage controlled oscillator is divided, for example with a 31-stage Johnson Counter (JC) to scale up the VCO frequency and reduce the overall phase noise. This combination reduces the area overhead by more than 60×. In this way the hybrid ADC architecture 10 (1) pushes the noise transfer function of a VCO-based ΣΔ loop to a higher order, (2) provides low phase noise and excellent linearity, (3) is easy to stabilize, and (4) still remains area-efficient.

Figure 4:
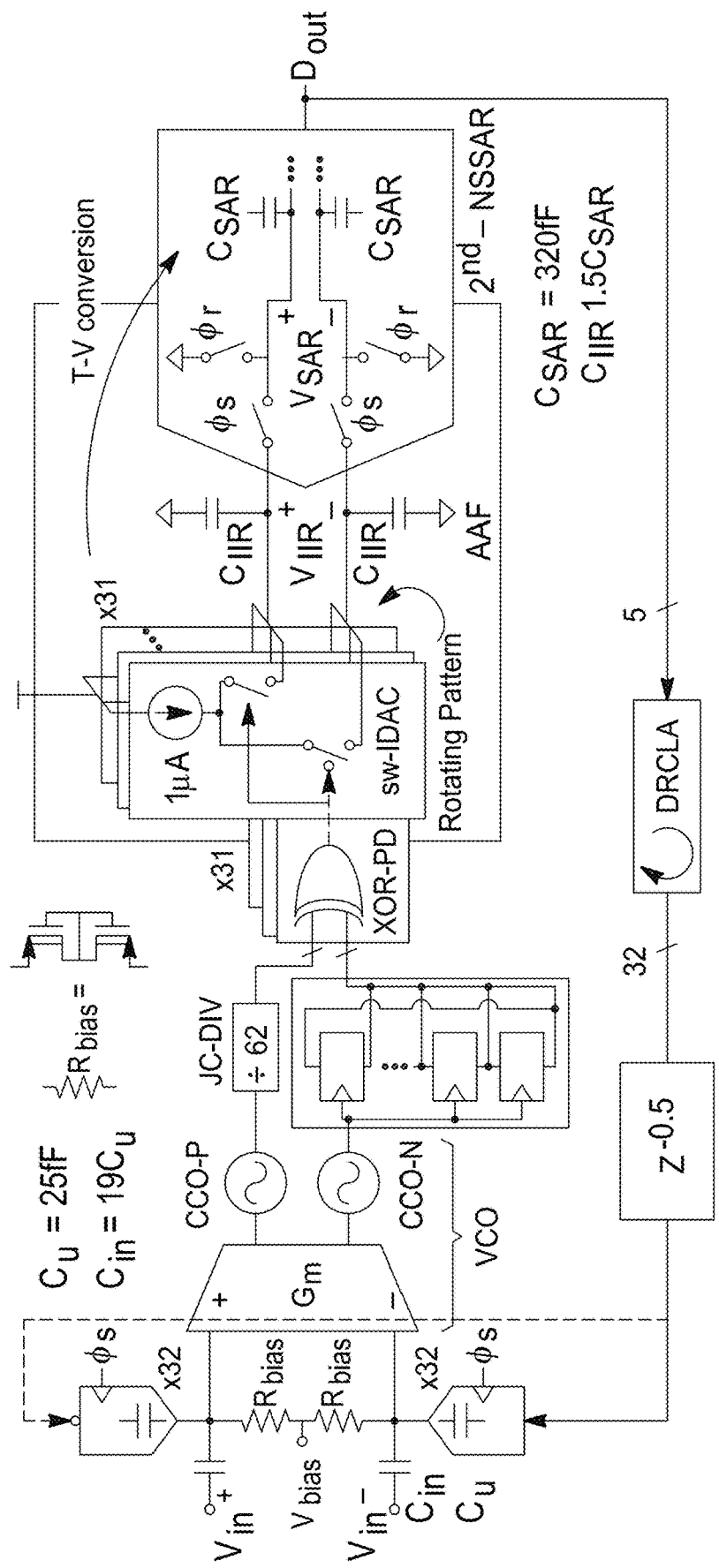
FIG. 4 is a detailed schematic for the hybrid ADC.
Figure 5:
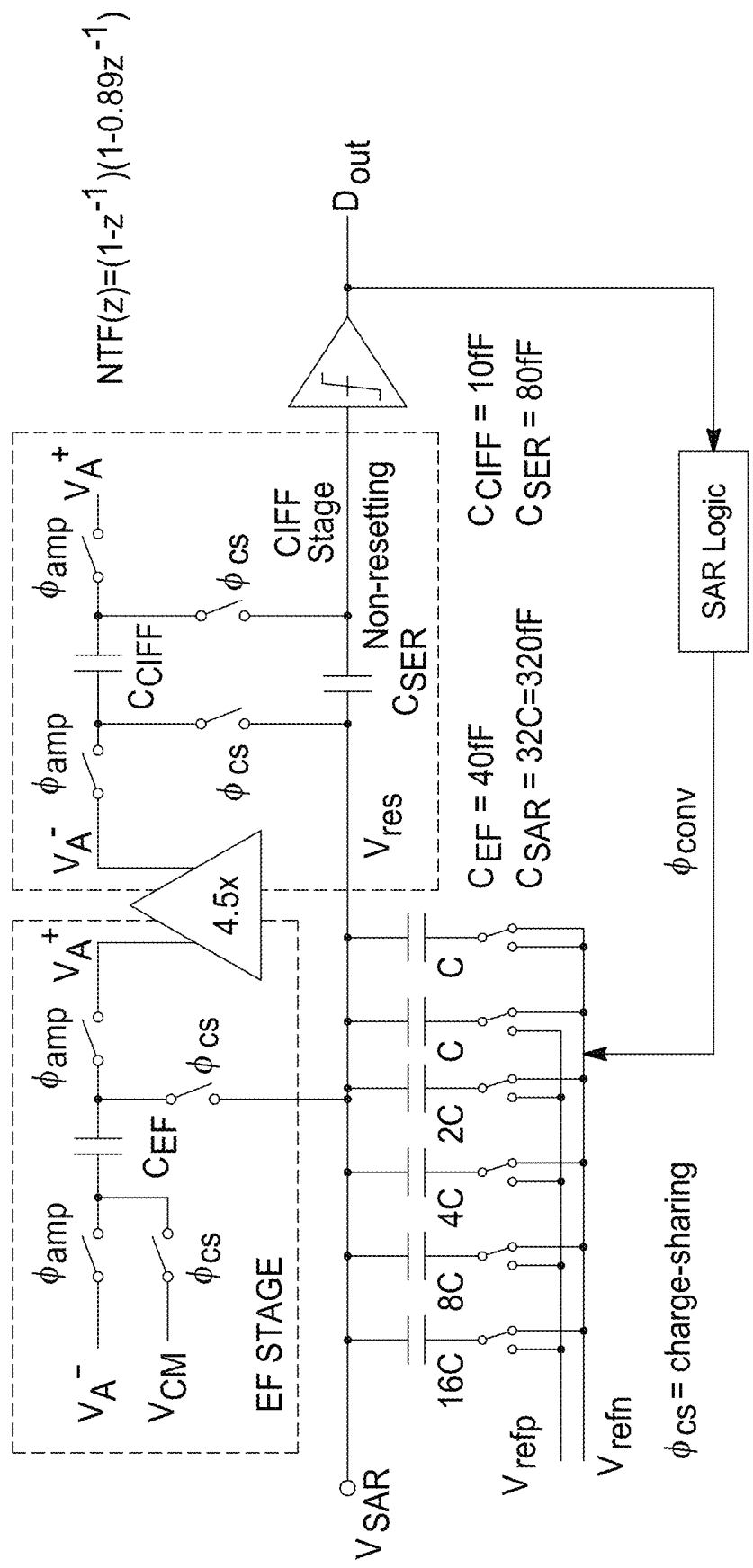
FIG. 5 is a half circuit schematic of a 5-bit noise shaping successive approximation register quantizer.

FIG. 4 depicts a detailed schematic for the hybrid ADC 10. Since noise shaping successive approximation register determines two of the three zeros in the overall noise transfer function, one should be cautious about NS SAR coefficient variation. In this implementation, a 2nd-order 5-bit NS SAR quantizer with cascade noise shaping was adopted to desensitize its NTF coefficients. The 5-bit NS SAR quantizer is further depicted in FIG. 5. In addition, the 2nd stage is changed from Error-Feedback (EF) to Cascade-Integrator Feedforward (CIFF) so that residue integration employs a non-resetting serial capacitor CSER. Therefore, kT/C noise due to a reset is avoided, and a 4× smaller capacitor can be used.

Figure 6:
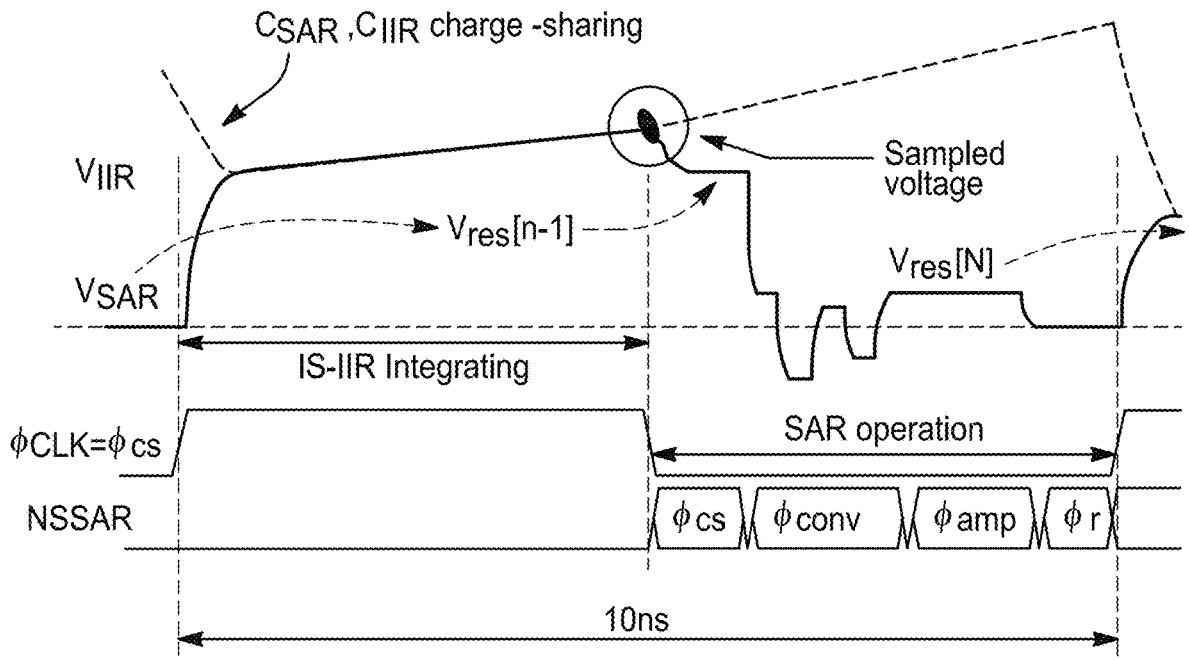
FIG. 6 is a timing diagram for the hybrid ADC.

With reference to FIG. 6, when φCLK rises, switch φS closes so that charge-sharing takes place between CIIR and CSAR, and also the current-switching DAC integrates (charging) currents onto both capacitors. When the φCLK falls, switch φS opens, and CSAR samples the input and starts SAR conversion while CIIR continues integrating. A periodic reset or prevents the integrating charges from saturating.

Figure 7A:
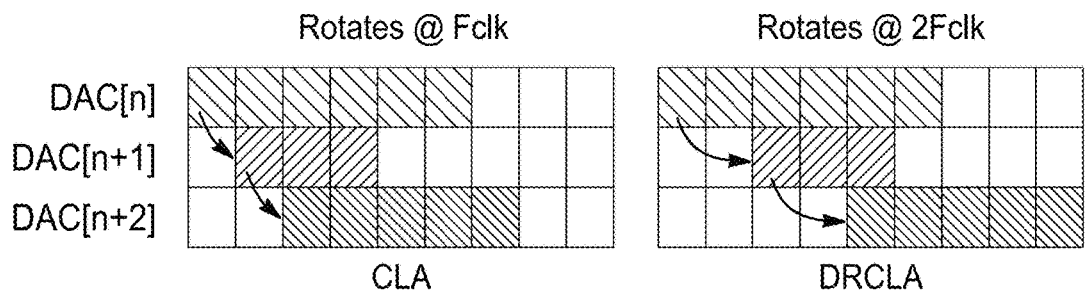
FIG. 7A is diagram illustrating an improved clocked-averaging technique for the hybrid ADC.
Figure 7B:
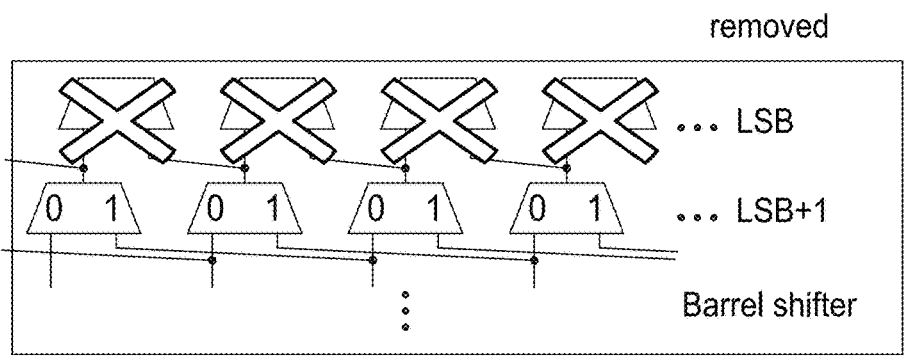
FIG. 7B is a diagram of a portion of a barrel shifter circuit.

In another aspect of this disclosure, the mismatch between the output of the quantizer and the input of the voltage controlled oscillator shaped. More specifically, depth reduced clocked averaging can be used to shape the feedback to the voltage controller oscillator. In an example embodiment, a clocked-averaging circuit is inserted into the feedback path. The clocked-averaging circuit converts bits from the quantizer to bits encoded with unary coding and then shifts the bits with unary coding two bit positions each clock cycle as seen in FIG. 7A. Compared to conventional data-weighted averaging, which uses complex logic to manipulate a data pointer, clocked-averaging (CLA) only requires a simple sequential counter. For example, the clocked-averaging circuit can be implemented using a barrel shifter circuit having a series of multiplexers, where the layer of multiplexers for handling the least significant bit removed from the circuit as shown in FIG. 7B. That is, the least significant bit of the pointer is further truncated to remove one layer of multiplexers and simultaneously double the rotation speed, pushing shaped tone 2× further away from the in-band. As a result, the delay of this logic together with the noise shaping successive approximation register can fit in 5 ns (half clock cycle) and saves 15% area compared to a full-depth clocked-averaging.

For demonstration purposes, a 28 nm CMOS prototype of the hybrid ADC 10 demonstrates 84.2 dB peak SNDR, −99.1 dBc IMD, and 86.8 dB DR with DAC mismatch effectively suppressed by depth reduced clocked averaging. The total power consumption is 1.62 mW. The proposed hybrid ADC architecture only adds 15% more power and 33% more area to a 1st-Order VCO ΣΔ loop but boosts overall noise transfer function up to $3^{rd}$-order.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

What is claimed is:

1. An analog-to-digital converter, comprising:
a voltage controlled oscillator configured to receive an an input voltage and outputs a voltage whose frequency varies according to the input voltage;
a quantizer circuit with noise shaping capability;
an anti-aliasing filter interconnected between an output of the voltage controlled oscillator and an input of the quantizer circuit;
a feedback path from an output of the quantizer to an input of the voltage controlled oscillator; and
a clocked-averaging circuit in the feedback path, where the clocked-averaging circuit converts bits from the quantizer to bits encoded with unary coding and shifts the bits with unary coding two bit positions each clock cycle.

2. The analog-to-digital converter of claim 1 wherein the clocked-averaging circuit includes a barrel shifter circuit having a series of multiplexers.

3. The analog-to-digital converter of claim 1 exhibits a noise transfer function having third order.

4. An analog-to-digital converter, comprising:
a voltage controlled oscillator configured to receive an input voltage and outputs a voltage whose frequency varies according to the input voltage;
a Johnson counter serially coupled between the voltage controlled oscillator and a phase detector, where the Johnson counter is configured to receive the output from the voltage controlled oscillator and operates to divide frequency of the output received from the voltage controlled oscillator;
a quantizer circuit with noise shaping capability;
an anti-aliasing filter interconnected between an output of the phase detector and an input of the quantizer circuit, where notches of the anti-aliasing filter align with sampling frequency of the quantizer circuit;
a feedback path from an output of the quantizer to an input of voltage controlled oscillator; and
a clocked-averaging circuit in the feedback path, where the clocked-averaging circuit converts bits from the quantizer to bits encoded with unary coding and shifts the bits with unary coding two bit positions each clock cycle.

5. The analog-to-digital converter of claim 4 wherein the anti-aliasing filter includes an integration sampler circuit and an infinite impulse response filter.

6. The analog-to-digital converter of claim 4 wherein the quantizer circuit operates to convert a continuous analog signal from the anti-aliasing filter into a discrete digital representation using a binary search.

7. The analog-to-digital converter of claim 4 wherein the quantizer circuit includes a successive approximation register with second order noise shaping.

8. The analog-to-digital converter of claim 4 wherein the clocked-averaging circuit includes a barrel shifter circuit having a series of multiplexers.

* * * * *